July 9, 1957 S. H. M. DODINGTON 2,798,947

AUTOMATIC LEVEL CONTROL OF LOCAL OSCILLATION IN SUPERHETERODYNE RECEIVER

Filed June 4, 1954

INVENTOR
SVEN H. M. DODINGTON

BY
Ernest Fanwick
ATTORNEY

United States Patent Office 2,798,947
Patented July 9, 1957

2,798,947

AUTOMATIC LEVEL CONTROL OF LOCAL OSCILLATION IN SUPERHETERODYNE RECEIVER

Sven H. M. Dodington, Nutley, N. J., assignor to International Telephone and Telegraph Corporation, Nutley, N. J., a corporation of Maryland Application June 4, 1954, Serial No. 434,610

10 Claims. (Cl. 250—20)

Figure 1:
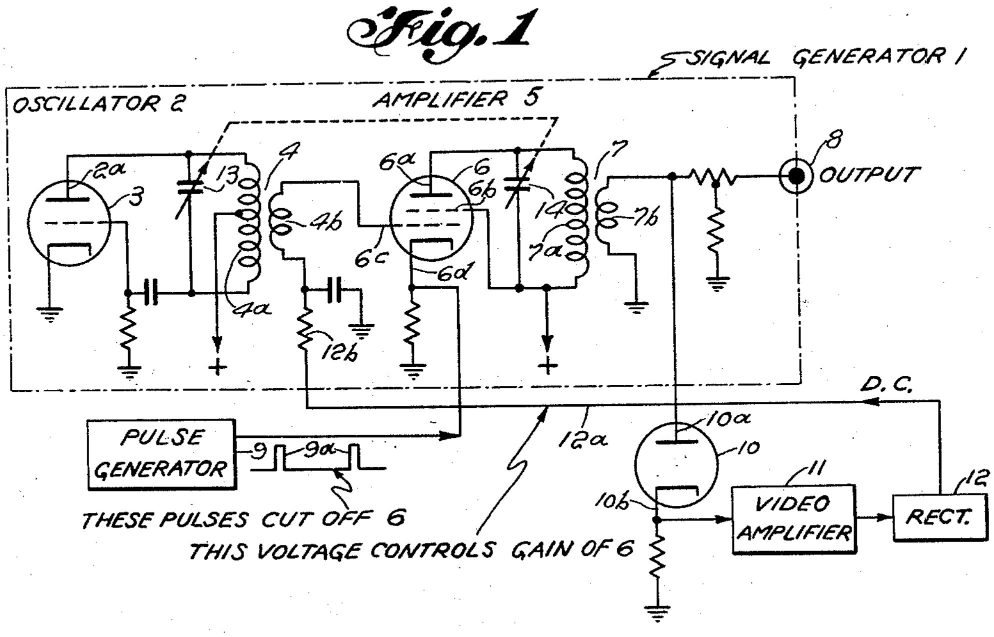

This invention relates to signal level control circuits and more particularly to an automatic level control circuit for use with sources of oscillatory radio-frequency energy such as continuous wave (C. W.) signal generators, local oscillators and radio receivers.

Many C. W. signal generators designed for producing output energy over a wide frequency range have proven unsatisfactory because the output level of the device varied appreciably as the frequency of the output changed or even in some cases the output level varied when the load impedance changed even though the output frequency was maintained constant. When such a generator was used intermittently, some variation of the output level could be tolerated because manual adjustment sufficed to equate the output to any predetermined factor. However, where the equipment is in moderately continuous use continual readjustment becomes quite tedious and thus the design of the generator has proved unsatisfactory. In many situations such as where a signal generator is employed as a local oscillator in a radio receiver, manual adjustment of the output level is impossible. Such situations demanded that a signal generator be made available which incorporates as a feature, a circuit providing for automatic level control of the output signal.

One system for providing such automatic level control would comprise a circuit in which a portion of the output of the signal generator was rectified to yield a direct voltage for use in controlling the gain of some preceding stage of the generator. Such a system met with difficulty when it was attempted to be put into practical use because it was found that the rectifier output seldom exceeded a fraction of a volt and thus the control voltage which was fed back to a preceding stage was extremely feeble. To overcome the feebleness of the feedback control voltage D.-C. amplification of the control voltage was resorted to, but such amplification introduced the additional difficulties of drift and variability within the D.-C. amplifier circuitry. In lieu of amplifying the control voltage once it has been generated, the signal generator could be made more powerful and thus provide a sufficiently large control voltage at its output. Of course, such a solution is not economical nor within the boundaries of good engineering practice.

One of the objects of this invention, therefore, is to provide an automatic level control circuit for signal generators in which a control voltage of sufficient amplitude is fed back to a preceding stage to vary the gain.

Another object of this invention is to provide an automatic level control voltage suitable for amplification prior to rectification.

A further object of this invention is to provide a circuit for developing an automatic level control voltage as an attenuating voltage signal which may be rectified and used to vary the gain of a preceding stage.

A feature of this invention is the use of an automatic level control circuit in a signal generator which is continuously modulated by the output of a pulse generator whose output pulses are of sufficient amplitude to bring the signal level to zero during the pulse duration. At the output of the signal generator a video pulse is detected whose amplitude is exactly proportional to the signal level and which can be amplified in a video amplifier and rectified to produce a suitably large control voltage which is fed back to a preceding stage of a signal generator.

Figure 2:
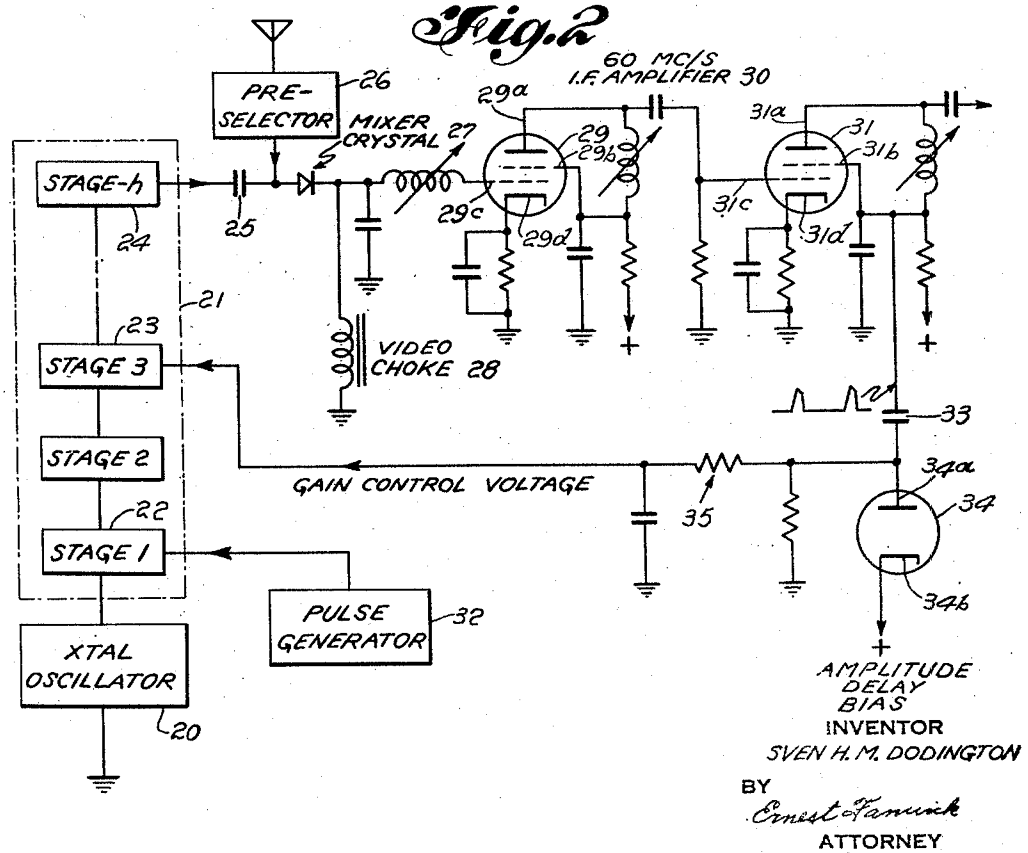

The above-mentioned and other features and objects of this invention will become more apparent by reference to the following description taken in conjunction with the accompanying drawings, in which:

Fig. 1 is a schematic diagram partly in block form of one embodiment of the automatic level control circuit of this invention for use in a signal generator; and, Fig. 2 is a schematic diagram partly in block form of the automatic level control circuit of my invention for use in a crystal controlled superheterodyned receiver.

Referring to Fig. 1 of the drawing, one embodiment of the automatic level control circuit in accordance with the principles of my invention is shown for use with a continuous wave generator. The signal generator 1 comprises a source of oscillatory energy 2, which may take the form of any of the well-known vacuum tube oscillators, whose output is taken from the anode 2*a* of vacuum tube 3 and inductively coupled by transformer 4 to an amplifier section 5. The amplifier stage 5 comprises a multi-element vacuum tube 6 having one grid 6*c* coupled to the secondary 4*b* of transformer 4 and its other grid 6*b* coupled to one side of transformer 7. The primary winding 7*a* of the transformer 7 is coupled between grid 6*b* and the anode 6*a* of the amplifier 6. The oscillatory energy from source 2 amplified in amplifier stage 5 is inductively coupled via transformer 7 to output terminal 8. As is usual tuning for each stage is provided by mechanically coupling together the variable capacitors 13 and 14. A pulse generator 9 generates a series of pulses 9*a* which are coupled to the cathode 6*d* of electron discharge device 6 in amplifier stage 5. The pulses 9*a* from pulse generator 9 are of sufficient amplitude that when coupled to the cathode 6*d* tube 6 is caused to be cut off, thus interrupting the oscillatory energy from being coupled to the output terminal 8 through amplifier stage 5. The output signal coupled over transformer 7 comprises the oscillatory energy which has been amplified and interrupted due to the cut off of tube 6 responsive to pulses 9*a* from pulse generator 9. A portion of the output of this signal generator is coupled to detector means 10 comprising a diode vacuum tube where the pulsed interruptions of the oscillatory energy are detected and coupled from the cathode 10*b* to a video amplifier 11 where the detected pulses are amplified and coupled to the input of a rectifier device 12. The output of the rectifier 12 comprises a direct voltage which is coupled back over line 12*a* and through resistance 12*b* and winding 4*b* to the grid 6*c* of tube 6 of amplifier stage 5. Since the direct voltage from rectifier 12 is applied to grid 6*c* it functions as a biasing voltage and therefore controls the gain within the vacuum tube 6 and thus within the amplifier stage 5.

In accordance with the principles of my invention the signal generator 1 is continously negatively modulated with a pulse on the cathode of sufficient amplitude to bring the signal level to zero during the duration of the pulse. This is accomplished by coupling the output of pulse generator 9 to the cathode 6*d* of tube 6. Since the signal level is brought to zero during the duration of the pulse any method which would 100% pulse modulate the carrier wave would be sufficient for the purposes of this invention. The pulse repetition frequency and the pulse duration of the output of the pulse generator 9 are chosen to have a negligible effect upon the desired function for the output of signal generator 1. For example, if the signal generator 1 is designed to function as a local oscillator in a pulse signal receiver it is entirely practicable to have the pulse repetition frequency of the output of pulse generator 9 set at 200 pulses per second and the pulse duration of each of the pulses set at 1 microsecond duration, thus causing a count down in the received information of only .02%. If the signal generator 1 is to function as the local oscillator of a radar receiver, the pulse repetition frequency can be synchronized with that of an associated transmitter and so timed that the pulse outputs from generator 9 occur when no reception is expected, for example, just prior to the transmission from the radar transmitter.

The detector 10 at the output of the signal generator 1 detects a video pulse whose amplitude must be exactly proportional to the carrier level since the oscillator output signal is 100% modulated. The video pulse output of detector 10, even if of extremely small amplitude, can be readily amplified at the video amplifier 11 which is of known constant gain and the output of which is rectified to produce a suitably large control voltage.

Referring to Fig. 2 of the drawing, an embodiment of my invention for use with a crystal controlled superheterodyned receiver is shown. The receiver illustrated in Fig. 2 was designed for use in the 1,000 megacycle frequency range, and in order to reach the necessary power and frequency level a multiplicity of stages of amplification are used for the output of a crystal controlled oscillator 20. The output of the crystal controlled oscillator 20 is coupled to a multiplier circuit 21 having a plurality of stages as indicated for example at 22, 23 and 24. The output of the multiplier stage 21 is coupled, via capacitor 25, along with the output of a pre-selector circuit 26, to a mixer crystal 27. The signal generator portion comprising the oscillator 20 and multiplier 21, of course, functions as the local oscillator of the receiver and rectification of the local oscillator output voltage occurs in the mixer crystal 27 with the resulting voltage induced across the video choke 28 which is coupled to the mixer crystal 27. The mixed output of the mixer crystal 27 is coupled to a control grid 29*c* of vacuum tube 29 which is part of the first stage of an I.-F. amplifier 30. The output of the first stage of the I.-F. amplifier 30 is coupled to a control grid 31*c* of vacuum tube 31 in the second stage of the I.-F. amplifier 30.

A pulse generator 32 similar to generator 9 in Fig. 1 couples a series of pulses to the first stage 22 of the multiplier 21 to 100% modulate the output of the crystal oscillator 20. The stage 22 corresponds to amplifier 5 in Fig. 1. The resulting pulsed signal voltage is induced across the video choke 28 and the first two stages of the receiver I.-F. amplifier 30 are arranged to pass these video pulses providing at the same time a suitable degree of pulse amplification. A portion of the output of the second stage of the I.-F. amplifier 30 is coupled across capacitor 33 to detector 34 whose output after integration by circuit 35 controls the gain of the crystal multiplier 21 in the local oscillator circuit. By coupling suitable voltage bias to the cathode 34*b* of detector tube 34 a suitable amplitude delay can be incorporated to cut out the automatic control whenever the signal generator output becomes excessively weak. The need for some sort of automatic signal level control is emphasized when test results showed that variations in the mixer crystal output current of 50:1 have been encountered merely when the frequency of the local oscillator has been changed, and further variations of course are to be expected when the line voltage changes and when the vacuum tubes age. Through the use of the automatic level control circuit of this invention the signal level output variations can be reduced with subsequent ease and associated manufacturing tolerances.

While I have described above the principles of my invention in connection with specific apparatus, it is to be clearly understood that this description is made only by way of example and not as a limitation to the scope of my invention as set forth in the objects thereof and in the accompanying claims.

I claim:

1. A signal level control circuit comprising a source of oscillations, means to amplify said oscillations, a source of pulse signals, means to substantially one hundred percent modulate said oscillations responsive to said pulses, means to detect in said modulated oscillations a pulse having an amplitude substantially proportional to the peak amplitude of said amplified oscillations, means to rectify the output of said detector means to produce a control voltage and means to vary the gain of said amplifier means responsive to said control voltage.

2. A circuit according to claim 1 wherein said amplifier means comprises at least an electron discharge device having a cathode, an anode and at least one control grid, said oscillations being coupled to said control grid, means to couple said pulse signals to said cathode to modulate said oscillations and means to feed back said control voltage to said control grid to vary the gain of said amplifier.

3. A circuit according to claim 2 wherein said electron discharge device has a predetermined cut-off value and said pulse amplitudes are sufficient to cause said device to reach cut-off.

4. A circuit according to claim 1 wherein said means to detect said pulse modulation comprises an electron discharge device having two elements, means to couple one of said elements to the output of said amplifier means, a second amplifier device having its output coupled to said rectifier means and means to couple the other of said elements to said second amplifier.

5. A signal level control circuit for a signal generator having at least oscillator means to produce a carrier signal and amplifier means for said carrier signal, comprising means to generate a series of pulses of predetermined duration and having an amplitude at least as great as the peak amplitude of said carrier signal, means to negatively modulate said carrier signal output of the oscillator means of said generator responsive to said series of pulses to cause the level of said carrier to be reduced to substantially zero due to said pulse modulation, means to detect in the output of said amplifier means a pulse having an amplitude substantially proportional to the peak amplitude of said carrier signal, means to rectify said detected pulses to produce a control voltage and means to couple said control voltage to said amplifier means to vary the gain thereof.

6. A signal generator comprising an oscillator, an amplifier including an electron discharge device having at least a cathode, an anode and a control grid, means to couple the output of said oscillator to said control grid, a source of pulse signals having an amplitude at least as great as the peak amplitude of the output of said oscillator, means to couple said pulse signals to said electron discharge device to cause said device to be cut-off during the duration of each pulse signal, means to detect in the output of said amplifier pulses having an amplitude proportional to the peak amplitude of the output of said oscillator, means to amplify said detected signals, means to rectify said amplified detected signals to produce a control signal and means to couple said control signal to said control grid.

7. In a signal generator having at least a source of oscillatory energy an amplifying means for said oscillatory energy, a source of pulses, means to interrupt said oscillatory energy responsive to said pulses to produce a substantially one hundred percent modulated signal, means to detect the pulsed signals of said modulated energy, means to amplify said detected pulsed signals, means to produce a control voltage from the amplified output of said detector means and means to couple said control voltage to said amplifier means to vary the gain thereof.

8. A signal generator comprising a vacuum tube oscillator, an amplifier having an electron discharge device including at least an anode, cathode and first and second control grids, means to inductively couple the output of said oscillator to said amplifier, output coupling means for the output of said amplifier, a pulse generator, means to couple the output of said pulse generator to the cathode of said amplifier to cause said electron discharge device to be cut off, means to detect the pulsed output of said electron discharge device, means to couple a portion of the output of said amplifier device to said detector means, means to rectify the output of said detector means to produce a control voltage responsive to said pulsations and means to couple said control voltage to the first of said control grids to vary the bias of said amplifier means.

9. A superheterodyned receiver comprising a crystal oscillator multi-stage frequency multiplier means coupled to the output of said crystal oscillator, means to receive radio signals, pre-selector means for said received signals, means to mix the output of said multiplier means and said pre-selector means, amplifier means for the output of said mixer means, means to generate a series of pulses, means to interrupt the output of said multiplier means responsive to said pulses, means to detect from the output of said amplifier means said pulsed interruptions, means to generate a control signal responsive to the output of said detector means and means to couple said control signal to one of the stages of said multi-stage multiplier means to vary the gain thereof.

10. A receiver according to claim 9 wherein said means to detect comprises a diode having one element coupled to the output of said amplifier means and a source of biasing voltage coupled to the other of said diode elements.

References Cited in the file of this patent

UNITED STATES PATENTS

| | | |
|---|---|---|
| 1,916,358 | Bruce | July 4, 1933 |
| 2,454,415 | Tourshou | Nov. 23, 1948 |
| 2,632,100 | Todd | Mar. 17, 1953 |

FOREIGN PATENTS

| | | |
|---|---|---|
| 416,501 | Great Britain | Sept. 17, 1934 |
| 421,786 | Great Britain | Dec. 31, 1934 |